(12) United States Patent
Bouchoucha et al.

(10) Patent No.: US 8,860,186 B2
(45) Date of Patent: Oct. 14, 2014

(54) METHOD FOR MANUFACTURING AN INTEGRATED CIRCUIT COMPRISING VIAS CROSSING THE SUBSTRATE

(71) Applicant: STMicroelectronics (Crolles 2) SAS, Crolles (FR)

(72) Inventors: Mohamed Bouchoucha, Gardane (FR); Laurent-Luc Chapelon, Domene (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/766,925

(22) Filed: Feb. 14, 2013

(65) Prior Publication Data
US 2013/0207279 A1   Aug. 15, 2013

(30) Foreign Application Priority Data

Feb. 15, 2012  (FR) ...................... 12 51386

(51) Int. Cl.
*H01L 29/40*  (2006.01)
*H01L 21/768*  (2006.01)
*H01L 23/48*  (2006.01)
*H01L 23/522*  (2006.01)

(52) U.S. Cl.
CPC ...... *H01L 21/768* (2013.01); *H01L 2224/16146* (2013.01); *H01L 21/76898* (2013.01); *H01L 2224/05548* (2013.01); *H01L 2224/02372* (2013.01); *H01L 2224/05* (2013.01); *H01L 2224/13024* (2013.01); *H01L 2224/13* (2013.01); *H01L 23/481* (2013.01); *H01L 23/522* (2013.01)
USPC ................... 257/621; 257/698; 257/E23.141

(58) Field of Classification Search
CPC ................. H01L 2924/0014; H01L 21/76898; H01L 23/485; H01L 23/562
USPC ........... 257/621, 626, 698, 700, 758, E23.141
See application file for complete search history.

(56) References Cited

U.S. PATENT DOCUMENTS

| 2006/0290002 A1 | 12/2006 | Arana et al. |
| 2008/0251932 A1* | 10/2008 | Arana et al. ................. 257/774 |
| 2010/0123254 A1 | 5/2010 | Kraft et al. |
| 2010/0224966 A1 | 9/2010 | Chen |
| 2010/0244201 A1 | 9/2010 | Kitada |
| 2011/0198747 A1 | 8/2011 | Kuo et al. |

* cited by examiner

*Primary Examiner* — Thanhha Pham
(74) *Attorney, Agent, or Firm* — The Noblitt Group, PLLC

(57) ABSTRACT

A method for forming an integrated circuit including the steps of:
forming electronic components on a first surface of a substrate;
forming a stack of interconnection levels on the first surface, each interconnection level including conductive tracks separated by an insulating material;
forming at least one hole from a second surface of the substrate, opposite to the first surface, the hole stopping on one of the conductive tracks;
depositing, on the walls and the bottom of the hole, a conductive layer and filling the remaining space with a filling material; and
forming, in an interconnection level or at the surface of the interconnection stack, and opposite to said at least one hole, at least one region of a material having a modulus of elasticity greater than 50 GPa and an elongation at break greater than 20%, insulated from the conductive tracks.

7 Claims, 2 Drawing Sheets

METHOD FOR MANUFACTURING AN INTEGRATED CIRCUIT COMPRISING VIAS CROSSING THE SUBSTRATE

CROSS REFERENCE TO RELATED APPLICATION

This application is a translation of and claims the priority benefit of French patent application number 12/51386, filed on Feb. 15, 2012, entitled "METHOD FOR MANUFACTURING AN INTEGRATED CIRCUIT COMPRISING VIAS CROSSING THE SUBSTRATE," which is hereby incorporated by reference to the maximum extent allowable by law.

BACKGROUND

1. Technical Field

The present disclosure relates to a method for manufacturing an integrated circuit comprising vias crossing a substrate, thus decreasing the thermodynamic stress in the vias, as well as the device obtained by this method.

2. Discussion

FIG. 1 illustrates an example of a three-dimensional integrated circuit.

This device comprises a first semiconductor substrate 10 having electronic components formed on its front surface 10f. In the example of FIG. 1, two MOS transistors 12 are shown at the surface of substrate 10, but it should be understood that in practice, many components are formed in substrate 10 and at the surface thereof.

Front surface 10f of substrate 10 is topped with an interconnection stack 14 comprising several interconnection levels. Each interconnection level comprises conductive tracks surrounded with insulating materials, conductive tracks of different interconnection levels being connected by conductive vias. The conductive tracks are schematically illustrated in FIG. 1.

A second semiconductor substrate 16 is also provided. On a first surface 16f of substrate 16 are formed electronic components, for example, MOS transistors 18. A stack of interconnection levels 20 extends at the surface of first surface 16f of substrate 16, and is formed of several interconnection levels comprising conductive tracks separated by insulating materials.

The two substrates 10 and 16 are positioned with respect to each other so that first surfaces 10f and 16f of each of the substrates face each other. Pads 21, respectively 22, are formed at the surface of interconnection stack 14, respectively 20. In the positioning of surfaces 10f and 16f in front of each other, pads 21 and 22 are provided to coincide. This enables to provide the bonding between the two substrates 10, 16, but also to provide an electric connection between components formed on substrate 10 and components formed on substrate 16. An insulating material 24 is generally provided to fill the space between the two interconnection stacks 14 and 20.

To form contacts on electronic components from the outside of the device of FIG. 1, vias crossing substrate 26, better known as "TSVs" (for Through-Silicon Vias) are formed in one or the other of substrates 10 and 16.

In the shown example, through vias 26 are formed in substrate 10, after thinning thereof. To for through vias 26, holes crossing the substrate are defined from rear surface 10b of substrate 10. The holes are provided to stop at the contact of conductive tracks of interconnection stack 14. A conductive track 28 is then deposited on the walls and the bottom of the holes. The space remaining in the holes is filled with a filling material 30.

As an example of numerical application, through vias may have, at the surface of substrate 10, dimensions ranging between 40 and 70 μm, and layer 28 may have a thickness ranging between 1 and 7 μm.

On the side of the second surface (rear surface 10b) of substrate 10 are formed conductive tracks 32, insulated from the outside of the device by an insulating layer 34. Such tracks allow an electric connection between the end of each through via and solder bumps 36 formed on rear surface 10b.

To obtain the device of FIG. 1, a conventional method comprises carrying out the step of:

forming electronic components on first surfaces 10f and 16f of solid substrates 10 and 16;

forming interconnection stacks 14 and 20 of the electronic components on first surfaces 10f and 16f of substrates 10 and 16;

forming bonding and electric contact pads 21 and 22 at the surface of each of interconnection stacks 14 and 20;

arranging substrate 16 on substrate 10 via bonding and electric contact pads 21 and 22;

filling the space between stacks 14 and 20 with an insulating material 24;

thinning substrate 10;

forming holes crossing substrate 10 from rear surface 10b to access conductive tracks of interconnection stack 14;

depositing a conductive layer 28 on the walls and the bottom of the holes and forming conductive tracks on rear surface 10b of the substrate;

filling the holes with filling material 30; and forming means of connection to the conductive tracks of surface 10b, for example, solder bumps 36.

Conductive material 28 forming a thin layer on the walls of holes 26 currently is a metal, for example, copper. Filling material 30 currently is a polymer. The material of layer 28 and filling material 30 thus have very different expansion coefficients. For example, copper has a thermal expansion coefficient on the order of 16 ppm/° C. and the filling polymers have thermal expansion coefficients on the order of 180 ppm/° C.

FIGS. 2 and 3 illustrate a problem which occurs after the filling of the remaining volume in the through vias with material 30. More specifically, FIG. 2 schematically illustrates this problem, while FIG. 3 is an enlarged view of a real device.

To allow the deposition of filling material 30, it is generally provided to heat the structure, which implies an expansion of polymer 30. As illustrated in FIGS. 2 and 3, the difference between the thermal expansion coefficients of region 30 and those of the neighboring regions implies that, when it is returned to an ambient temperature, polymer 30 shrinks more than the neighboring regions. Thus, the shrinking of material 30 drags along the metal deposited at the bottom of hole 26, as well as, for example, a first conductive track of interconnection stack 40 (covered with an insulating material 42, in FIG. 2). These regions thus form a curved membrane.

Significant stress thus appears on conductive material 28 located on the contour of the bottom of hole 26 as well as on regions 40 and 42. The stack formed by conductive material 28, first conductive track 40, and insulating material 42 being relatively thin, there is a risk of breakage 44 in this area of the TSV. The electric connection between a contact taken from rear surface 10b of substrate 10 and conductive track 40 is then broken.

It should be noted that the above stress also appears on forming of through vias in circuits other than three-dimensional circuits and are not linked to the forming of such circuits. Especially, this type of stress may also appear in front-side illuminated image sensors of a substrate, where vias crossing the substrate are provided to create a contact from the rear surface of the substrate with tracks of an interconnection stack formed on the front surface.

Thus, there is a need for a manufacturing method limiting the risk of breakage in the materials deposited at the bottom of the holes defining through vias.

BRIEF SUMMARY

An embodiment provides a method for manufacturing an integrated circuit comprising vias crossing the substrate, which limits the risk of breakage in the materials formed in these vias.

Another embodiment provides a device obtained by this method.

Thus, an embodiment provides a method for forming an integrated circuit, comprising the steps of forming electronic components on a first surface of a substrate;

forming a stack of interconnection levels on the first surface, each interconnection level comprising conductive tracks separated by an insulating material;

forming at least one hole from a second surface of the substrate, opposite to the first surface, the hole stopping on one of the conductive tracks; and depositing, on the walls and the bottom of the hole, a conductive layer and filling the remaining space with a filling material, forming, in an interconnection level or at the surface of the interconnection stack, and opposite to said at least one hole, at least one region of a material having a modulus of elasticity greater than 50 GPa and an elongation at break. greater than 20%, insulated from the conductive tracks, said regions having at least the extension of the cross-section of the vias in projection on these regions.

According to an embodiment, the region has a thickness greater than 1 μm.

According to an embodiment, the material of the region is selected from the group comprising copper, aluminum, nickel, and polymers such as polyimides.

According to an embodiment, the conductive layer deposited on the walls and the bottom of the hole is made of copper, the filling material being a polymer.

According to an embodiment, the hole has, at the surface of the substrate, dimensions ranging between 40 and 70 μm, and the conductive layer deposited on the walls and on the bottom of the hole has a thickness ranging between 1 and 7 μm.

According to an embodiment, the region is formed at the surface of the interconnection stack at the same time as pads of electric connection to a second integrated circuit installed at the surface, of the interconnection stack.

According to an embodiment, the region. is formed at the same time as conductive tracks of the interconnection stack.

Another embodiment provides an integrated circuit comprising a. semiconductor substrate having a first surface topped with a stack of interconnection levels, each interconnection level comprising conductive tracks separated by an insulating material, at least one via crossing the substrate providing an electric connection between a second surface of the substrate, and a conductive track, further comprising, in an interconnection level or at the surface of the interconnection stack and opposite to said via, at least one region of a material having a modulus of elasticity greater than 50 GPa and an elongation at break greater than 20%, insulated from the conductive tracks.

The foregoing and other features and benefits will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

To limit deformations and breakages due to the shrinking of the filling material of the through vias, it is provided to form, opposite to the end of each of the through vias, regions of a ductile material enabling to decrease the stress applied to the bottom of the vias.

Figure 4:
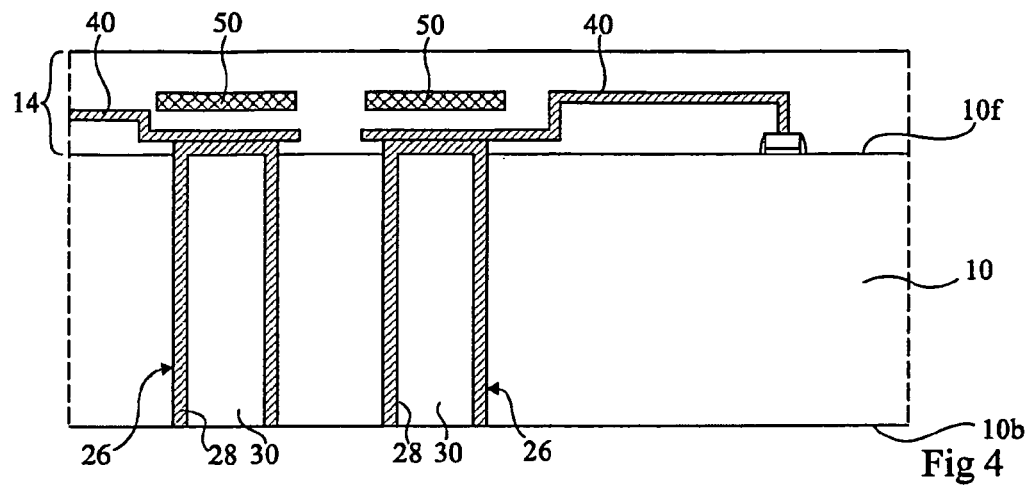
FIG. 4 illustrates the general principle of a method for manufacturing an integrated circuit according to an embodiment of the present invention.
Figure 5:
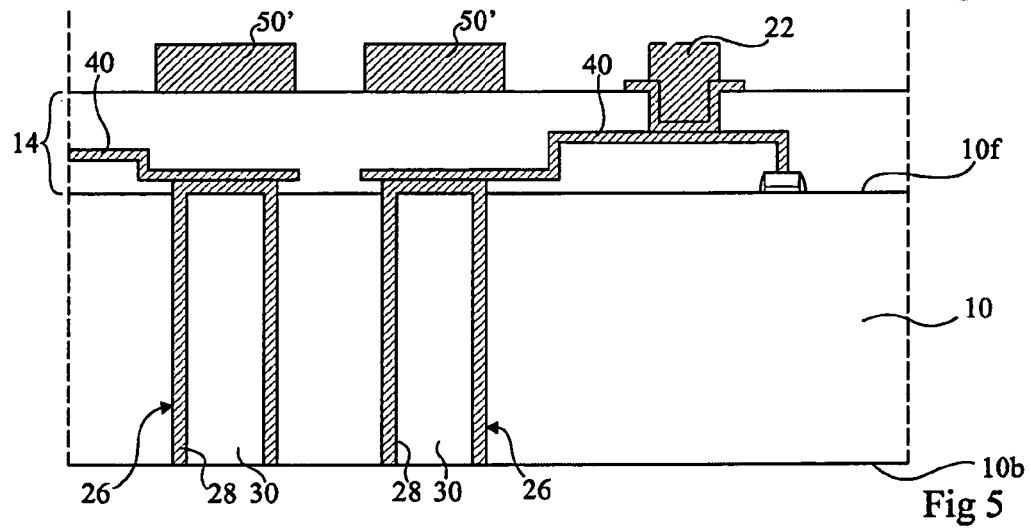
FIG. 5 illustrates an alternative embodiment of a manufacturing method according to an embodiment of the present invention.

FIG. 4 illustrates the general principle provided to limit the occurrence of breakages in through vias, and FIG. 5 illustrates an alternative embodiment of this general principle.

FIG. 4 illustrates an enlargement of the region of an integrated circuit in which through vias are formed. This drawing shows two through vias 26 crossing a substrate 10 from a rear surface 10b of substrate 10. Through vias 26 are provided to reach metal tracks 40 formed in an interconnection stack 14 which extends on front surface side 10f of substrate 10. Each through via 26 is formed of a hole crossing substrate 10, the walls and the bottom of the hole being covered with a conductive material 28, the rest of the hole being filled with a filling material 30, for example, a polymer.

In the shown example, the two through vias 26 are provided to reach conductive tracks 40 located in a are interconnection level of interconnection stack 14 located on front surface side 10f of substrate 10. It should be noted that through vias may also be provided to reach conductive tracks formed in different interconnection levels of interconnection stack 14.

To limit the stress on the contour of the bottom of through vias 26, it is provide to form, in interconnection stack 14, or at the surface thereof, and opposite to each of the vias crossing substrate 26, regions 50 of a rigid and ductile material, having a high modulus of elasticity and elongation at break. As an example, the material of regions 50 may have a modulus of elasticity greater than 50 GPa, for example, on the order of 110 GPa, and an elongation at break greater than 20%, for example, on the order of 60%. Regions 50 have at least the extension of the cross-section of the vias in projection on these regions.

In the example of FIG. 4, regions 50 are directly formed in interconnection stack 14, in an upper interconnection level of the interconnection level of tracks 40. It should be noted that, if region 50 is made of a conductive material, it does not take part in the conveyance of electric signals and is thus insulated from the conductive tracks of conveyance of useful electric signals.

As an example, region 50 may be made of a ductile metal such as copper, aluminum, or nickel, and may have a thickness greater than 1 μm. It may also he formed of a polymer having a high rigidity, for example, a polyimide, and have a thickness greater than 1 μm.

Figure 1:
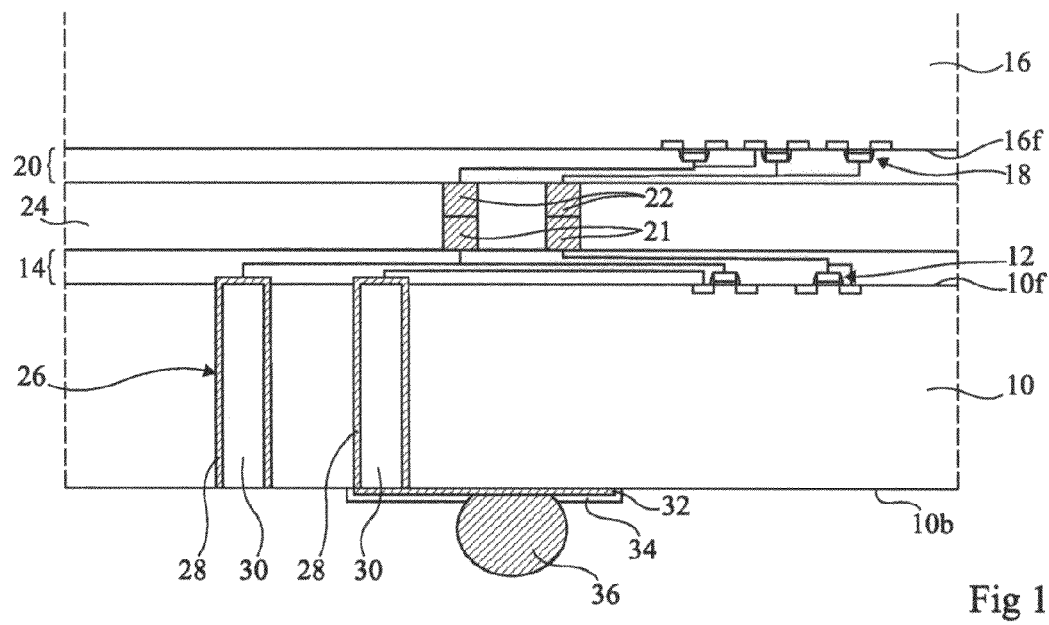
FIG. 1, previously described, illustrates a three-dimensional integrated circuit.
Figure 2:
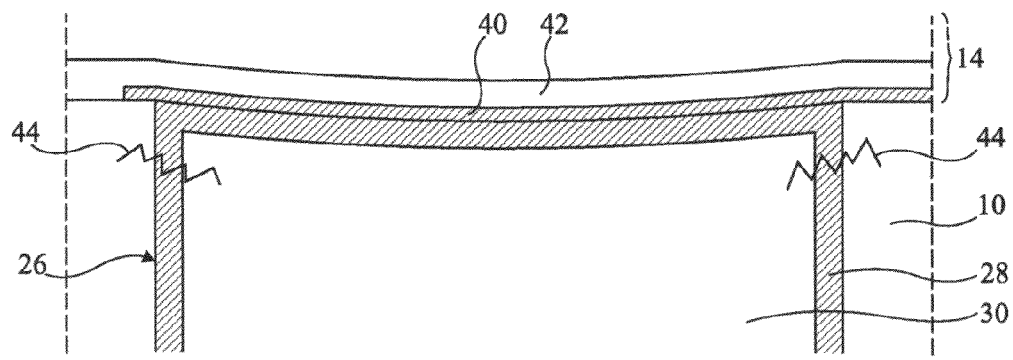
FIGS. 2 and 3, previously described, are enlargements of the device of FIG. 1.
Figure 3:
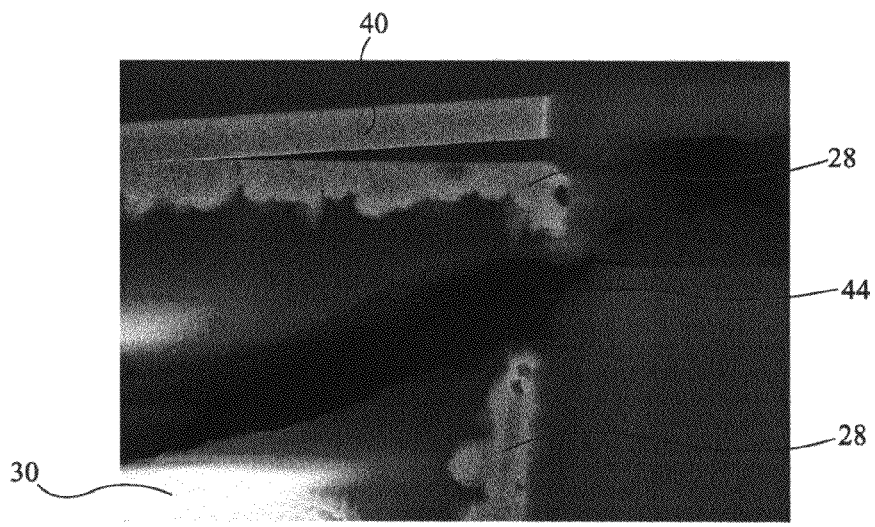

The device of FIG. 4 may be obtained by a method similar to the method described in relation with FIG. 1 with or without installation of an upper chip), except in that the method enabling to obtain the device of FIG. 4 comprises a step of forming of regions 50 in the interconnection stack or at the surface thereof, for example, by modification of the masks of definition of the interconnection levels.

FIG. 5 illustrates an alternative embodiment of regions 50 decreasing the deformation of the material at the bottom of the through vias, the regions of absorption of the deformation bearing reference numeral 50 in this drawing.

In the case of FIG. 5, the regions absorbing the deformation are not formed of regions 14 but of regions 50 formed at the surface of interconnection stack 14. It should be noted that this variation is particularly adapted to the case where the device is a three-dimensional integrated circuit, where 50' can be formed at the surface of the interconnection stack at the same time as pads 22 of connection to an upper chip, as illustrated in FIG. 5. It should be noted that the variation of FIG. 5 may also be provided in devices different from three-dimensional circuits, by providing, in this case, manufacturing steps specific to the forming of regions 50'. Regions 50' have at least the extension of the cross-section of the vias in projection on these regions.

As an example, regions 50 may thus be formed of copper pads which extend at the surface of the interconnection stack in the same way as bonding and electric connection pads 22 on an installed upper chip.

The device of FIG. 5 can be obtained by a method similar to that described in relation with FIG. 1 (with or without upper chip installation), except that the connection and bonding pad forming step is carried out by means of a modified mask, pads 50' taking no part in the electric connection with an upper chip.

Figure 6:
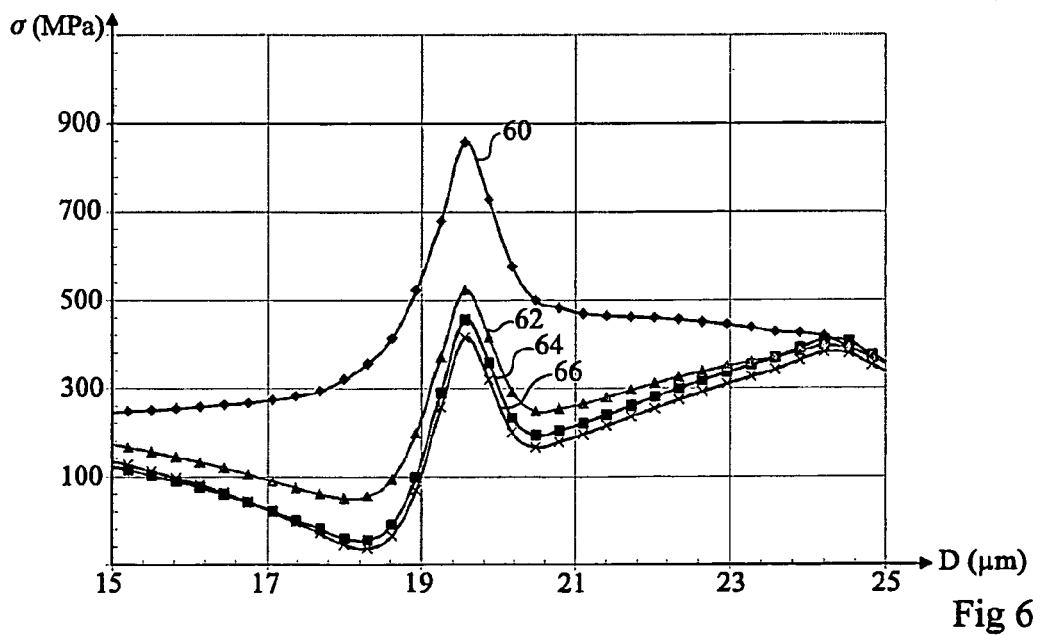
FIG. 6 shows a set of curves illustrating the effects of different devices for decreasing the stress in a through via according to embodiments of the present invention.

FIG. 6 shows a set of curves illustrating the effects of different devices for limiting the stress in a through via such as described herein.

In this drawing, four curves of the radial stress o in a through via according to distance I) to the center of the via are shown, to illustrate the impact of regions 50 and 50'.

First curve 60 illustrates the case of FIG. 1 where no stress reduction region is provided. in this case, it can be seen that, at the border of the through via, a stress on the order of 900 MPa appears after cooling of the structure at ambient temperature.

Curve 62 illustrates the case where an aluminum region 50 such as that discussed in relation with FIG. 4, having a thickness equal to 1 μm, is provided. Curve 64 illustrates the case where an aluminum region 50 such as that discussed in relation with FIG. 4, having a thickness equal to 2 μm, is provided. Curve 66 illustrates the case where a copper region 50 such as that discussed in relation with FIG. 4, having a thickness equal to 2 μm, is provided.

In each of the cases illustrated by curves 62, 64, and 66, it should be noted that the stress peak on the walls of the through via is decreased by at least 200 MPa with respect to the ease of FIG. 1 (curve 60).

Advantageously, regions 50 and 50' may he formed simultaneously to other regions provided in and/or on interconnection stack 14, which makes it possible to form these regions without increasing the complexity of the integrated circuit manufacturing method.

Various embodiments with different variations have been described hereabove. Those skilled in the art may combine various elements of these various embodiments and variations without showing any inventive step. It is especially provided to form, in front of each of through vias 26, several regions 50 in different interconnection levels, with or without additional regions 50', especially in the case of a three-dimensional circuit.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit comprising:
a semiconductor substrate having a first surface topped with a stack of interconnection levels, each interconnection level comprising conductive tracks separated by an insulating material;
at least one via crossing the semiconductor substrate providing an electric connection between a second surface of the semiconductor substrate and at least one of the conductive tracks, the walls and the bottom of said at least one via being covered by a conductive layer; and
in an interconnection level or at the surface of the stack of interconnection levels and opposite to said at least one via, at least one region of a material having a modulus of elasticity greater than 50 GPa and an elongation at break greater than 20%, wherein said at least one region is insulated from the conductive tracks and extends at least to an outer boundary of a projection of a cross-section of said at least one via on to said at least one region.

2. The integrated circuit of claim 1, wherein said at least one region of said material has a thickness greater than 1 μm.

3. The integrated circuit of claim 1, wherein the material of said at least one region is selected from the group comprising copper, aluminum, nickel, and polymers such as polyimides.

4. The integrated circuit of claim 1, wherein the conductive layer is made of copper.

5. The integrated circuit of claim 1, wherein said at least one via has, at the surface of the semiconductor substrate, dimensions ranging between 40 and 70 μm, and wherein the conductive layer has a thickness ranging between 1 and 7 μm.

6. The integrated circuit of claim 1, wherein said at least one region of said material is at the surface of the stack of interconnection levels, and further comprising an electric connection pad at the surface of the stack of interconnection levels.

7. The integrated circuit of claim 1, wherein said at least one region of said material is in the stack of interconnection levels.

* * * * *

UNITED STATES PATENT AND TRADEMARK OFFICE
CERTIFICATE OF CORRECTION

PATENT NO. : 8,860,186 B2
APPLICATION NO. : 13/766925
DATED : October 14, 2014
INVENTOR(S) : Mohamed Bouchoucha and Laurent-Luc Chapelon It is certified that error appears in the above-identified patent and that said Letters Patent is hereby corrected as shown below:

IN THE SPECIFICATION:
In column 1, line 64, please delete "for" and insert --form--;
In column 2, line 14, please delete "step" and insert --steps--;
In column 2, line 41, please delete "C." and insert --C--;
In column 2, line 58, please delete "42," and insert --42--;
In column 3, line 56, please delete the "," after the word "surface";
In column 3, line 57, please delete the "." after the word "region";
In column 3, line 60, please delete the "." after the word "a";
In column 3, line 65, please delete the "," after the word "substrate";
In column 4, line 50, please delete "are" and insert --same--;
In column 5, line 8, please delete "he" and insert --be--;
In column 5, line 12, please add a "(" before the word "with";
In column 5, line 21, please delete "50" and insert --50'--;
In column 5, line 23, please delete "50" and insert --50'--;
In column 5, line 35, please delete "50" and insert --50'--;
In column 5, line 48, please delete "o" and insert --σ--;
In column 5, line 49, please delete "I)" and insert --D--;
In column 5, line 52, please delete "in" and insert --In--;
In column 6, line 3, please delete "ease" and insert --case--;
In column 6, line 5, please delete "he" and insert --be--.

Signed and Sealed this
Third Day of February, 2015

Michelle K. Lee
*Deputy Director of the United States Patent and Trademark Office*